United States Patent
Sando

(10) Patent No.: US 8,466,430 B2
(45) Date of Patent: Jun. 18, 2013

(54) ELECTROSTATIC LENS

(71) Applicant: Canon Kabushiki Kaisha, Tokyo (JP)

(72) Inventor: Kazuhiro Sando, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/633,477

(22) Filed: Oct. 2, 2012

(65) Prior Publication Data

US 2013/0087717 A1 Apr. 11, 2013

(30) Foreign Application Priority Data

Oct. 5, 2011 (JP) .................................. 2011-221424

(51) Int. Cl.
*H01J 3/18* (2006.01)
*H01J 49/22* (2006.01)
*H01J 37/12* (2006.01)
*H01J 29/62* (2006.01)
*G21K 1/08* (2006.01)

(52) U.S. Cl.
USPC ............. 250/396 R; 250/492.22; 250/492.23; 250/398

(58) Field of Classification Search
USPC .................... 250/396 R, 492.22, 492.23, 398
See application file for complete search history.

(56) References Cited

U.S. PATENT DOCUMENTS

| 6,617,595 | B1 * | 9/2003 | Okunuki | 250/492.22 |
| 6,872,951 | B2 * | 3/2005 | Yagi et al. | 250/396 R |
| 7,126,141 | B2 * | 10/2006 | Ono et al. | 250/492.23 |
| 2005/0077475 | A1 * | 4/2005 | Nagae et al. | 250/396 R |

FOREIGN PATENT DOCUMENTS

| JP | 2005-57110 A | 3/2005 |
| JP | 2007-266525 A | 10/2007 |

OTHER PUBLICATIONS

Osamu Yamamoto et al., Charging and Flashover Characteristics of a Fused Quartz Spacer in Vacuum, IEEJ Transactions on Fundamentals and Materials, Aug. 1, 2003, pp. 429-435, vol. 123, No. 5, The Institute of Electrical Engineers of Japan, Tokyo Japan.

* cited by examiner

*Primary Examiner* — Nikita Wells
(74) *Attorney, Agent, or Firm* — Canon USA Inc IP Division

(57) ABSTRACT

An electrostatic lens includes multiple electrodes each having a through hole, and an insulating spacer that is provided between the electrodes and that fixes an interval between the electrodes. Both surfaces of the spacer are bonded with the electrodes opposing each other so that the spacer is integral with both the electrodes. A protective film is disposed on both surfaces of each of the electrodes. The protective film is present on the interior wall of the through hole and in a region around the through hole on the surface of the electrode. The region extends continuously from the interior wall to an end portion of the electrode. The protective film is not present at an interface between the electrode and the spacer.

9 Claims, 2 Drawing Sheets

ELECTROSTATIC LENS

BACKGROUND OF THE INVENTION

1. Field of the Invention

The present invention relates to an electrostatic lens included in a charged particle beam optical system used in an exposure apparatus using a charged particle beam.

2. Description of the Related Art

In electron beam exposure apparatuses, electron optical elements are used to control optical characteristics of an electron beam. An electron lens controls the beam diameter or the aberration of an electron beam. Electron lenses are classified into the electromagnetic type and the electrostatic type. Compared with electromagnetic electron lenses, electrostatic electron lenses need, for example, neither coils nor cores, achieving reduction in size and high integration easily. By using electrostatic lenses, an increase in the number of beams and high density can be easily achieved, resulting in an improvement in the throughput of an exposure apparatus and high resolution performance.

In Japanese Patent Laid-Open No. 2007-266525, a charged particle beam lens array is disclosed which is used for a multi-beam exposure apparatus and which is formed by bonding a silicon electrode plate and a glass spacer together. In Japanese Patent Laid-Open No. 2005-57110, a multi-charged beam lens is disclosed which is formed of spacers and electrodes, each of which is obtained by forming a gold thin film on silicon as a conductive film. In OSAMU YAMAMOTO et al., Charging and Flashover Characteristics of a Fused Quartz Spacer in Vacuum, IEEJ transactions on Fundamentals and Materials, pages 429-435, vol. 123, No. 5, Aug. 1, 2003, The Institute of Electrical Engineers of Japan, Tokyo, Japan (hereinafter, referred to as Non-Patent Document 1), characteristics of surface charging of a spacer which are obtained when a high voltage is applied to a gap of approximately several hundred micrometers to several millimeters are disclosed as experimental and theoretical research.

In positional control of an electron beam in an electrostatic lens including electrodes and an insulating spacer (hereinafter, simply referred to as a spacer), deflection of an electron beam may occur due to an influence of charging of the spacer disposed near a through hole of an electrode, through which the electron beam passes. Since the spacer is a supporting member for fixing the distance between the electrodes, the spacer needs to support the electrodes without distortion or the like. Accordingly, in order to achieve high resolution of an exposure apparatus, there has been an issue in which a spacer is to be disposed so as to fix the distance between electrodes disposed in a limited region, while reducing an influence on deflection of a beam. Typically, a silicon electrode is often used as an electrode in an electrostatic lens. However, in the case where a surface of the silicon electrode is oxidized, beam deflection may occur due to charging of the oxidized portion, in addition to beam deflection due to charging of a spacer.

To use an exposure apparatus stably, carbon contaminants or the like which are attached to an electrostatic lens in the exposure apparatus may be removed by oxygen plasma cleaning. Oxygen plasma cleaning causes oxidation of a surface of an electrode, resulting in an issue of suppression of displacement of the beam position caused by charging of the oxidized portion. A solution for preventing oxidation of an electrode is a protective film of a material, such as a noble metal or a conductive oxide, which is formed on the electrode. Typically, a configuration is employed in which a region close to a through hole is not oxidized. However, the relationship between deflection of a beam and the positions of the protective region of the gold thin film and the spacer is not always optimized.

In an electrostatic lens, it is important that corresponding ones of through holes of multiple electrodes are aligned with high precision, and that such a state is maintained. To achieve this, after positioning is performed, it is desirable that electrodes and spacers be integrated with each other by bonding so that a required strength is obtained. However, in the case where dust is to be removed from the inside by cleaning after the integration, it has been pointed out that such cleaning is difficult. In addition, in the case where a protective film is formed simply over a silicon electrode to prevent electrode oxidation, since the protective film is interposed at a bonding interface between the silicon electrode and a glass spacer, a problem arises in that stable bonding like bonding between silicon and glass is not achieved.

An example of the present invention may provide an electrostatic lens in which a protective film is disposed on an electrode and in which beam deflection due to charging is prevented. An example of the present invention may also provide an electrostatic lens which can achieve and maintain a high-precision positioning state of component members and which can also be easily handled.

SUMMARY OF THE INVENTION

An electrostatic lens according to a first aspect of the present invention includes multiple electrodes and a spacer. The electrodes each have at least one through hole. Corresponding ones of the through holes are aligned with each other. The spacer is provided between the electrodes and fixes an interval between the electrodes. A protective film is disposed on a surface of each of the electrodes, and the protective film is present on an interior wall of the through hole of the electrode and in a region around the through hole on the surface of the electrode. The region extends continuously from the interior wall to an end portion of the electrode. The protective film is not present between a surface of the electrode which opposes another electrode and the spacer. A distance l (meters) between an end portion of the protective film in the region around the through hole and the center of the through hole satisfies the following expression in the meter-kilogram-second-ampere unit system, $$l \geq (5 \times 10^3/3) \times (g/\phi acc) \times [-10.5 + \ln(g\Delta\phi/s)],$$

where a distance between the surfaces of the electrodes which oppose each other is represented by g (meters), a voltage difference between the electrodes is represented by $\Delta\phi$ (volts), an absolute value of an acceleration voltage of a charged particle beam is represented by $\phi acc$ (volts), and an allowed value of a center distance precision for the charged particle beam, i.e., the allowed amount of axial displacement in a direction orthogonal to the optical axis, is represented by s (meters).

An electrostatic lens according to a second aspect of the present invention includes multiple electrodes and a spacer. The electrodes each have at least one through hole. Corresponding ones of the through holes are aligned with each other. The spacer is provided between the electrodes and fixes an interval between the electrodes. Both surfaces of the spacer each are integral with a corresponding one of the electrodes by bonding. A protective film is disposed on both surfaces of each of the electrodes. The protective film is present on an interior wall of the through hole of the electrode and in a region around the through hole on each of the surfaces of the electrode. The region extends continuously from the interior wall to an end portion of the electrode. The protective film is not present between a surface of the electrode which opposes another electrode and the spacer.

For the electrostatic lens according to the first aspect of the present invention, parameters are set so as to satisfy the inequality described above, in view of the case where a region of the electrode surface in which the protective film is not disposed is oxidized and charged. According to the first aspect of the present invention, even when the spacer is charged or an electrode region in which the protective film is not disposed is charged due to oxidation, deflection, i.e., the amount of axial displacement, of a charged particle beam which is caused by charging can be made equal to or less than an allowed value. Accordingly, by using the electrostatic lens according to the first aspect of the present invention, for example, an exposure apparatus having higher resolving power can be provided.

In the electrostatic lens according to the second aspect of the present invention, a protective film is disposed on an electrode surface. The protective film is present on the interior wall of the through hole of the electrode and in a region around the through hole on the electrode surface, and is not present between the electrode and the spacer. According to the second aspect of the present invention, a high-precision positioning state can be maintained, and easy handling is also provided. In addition, reliability of the electrostatic lens is improved and a yield factor is also improved when the electrostatic lens is manufactured.

Further features of the present invention will become apparent from the following description of exemplary embodiments with reference to the attached drawings.

DESCRIPTION OF THE EMBODIMENTS

Figure 1A:
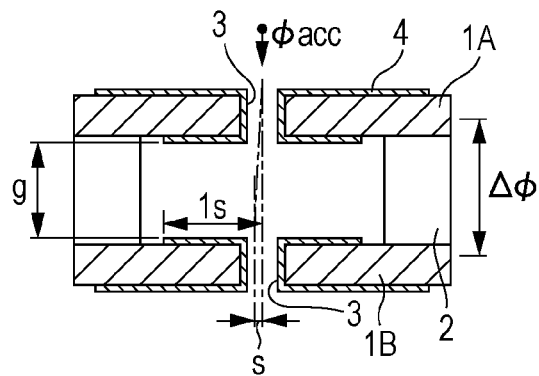
FIGS. 1A to 1D are schematic diagrams for explaining an electrostatic lens according to an embodiment of the present invention.

In an electrostatic lens according to an embodiment of the present invention, a protective film is disposed on both surfaces of an electrode. The protective film is formed on the interior wall of a through hole of the electrode and is formed in a region around the through hole on an electrode surface so as to extend continuously from the interior wall, but is not formed between the spacer and an electrode surface opposing another electrode. It is necessary to clean an electrostatic lens at regular time intervals because contaminants such as carbon are attached to the surface of a component member, such as an electrode or a supporting member, when the electrostatic lens is used, e.g., at the time of exposure. As a typical cleaning method, for example, an oxygen plasma process is performed. At that time, Si or the like which is a material of an electrode is oxidized, and the electrode surface may be easily charged or dimensional accuracy may be degraded. To address the problems caused by, for example, an oxygen plasma process, a protective film is provided on an electrode. However, this may result in degradation of the mounting precision of component members, e.g., a spacer and an electrode. In contrast, a position at which a through hole of an electrode is provided needs to be a position at which an influence of charging of members, such as a spacer and an oxidized region of an electrode, is not exerted. According to the embodiment of the present invention, a protective film is provided so as to cover a portion other than the mounting portion of an electrode, and a position at which a through hole is provided is specified by the relationship between the position of an end portion of the protective film and the position of the through hole, while the mounting precision is maintained. Accordingly, a charged particle beam passing through the through hole is not subjected to an influence of charging of members.

A constraint condition which is one of the characteristic configurations of the electrostatic lens according to the first embodiment of the present invention will be described. The constraint condition describes a distance l between an end portion of a protective film which is close to a creepage surface of the spacer and the center of a through hole in the meter-kilogram-second-ampere (MKSA) unit system, and aims to reduce beam deflection. When a spacer or an unprotected portion of an electrode is charged, an influence of electrical charge may cause deflection of a charged particle beam passing through the through hole. At that time, when the amount of electrical charge is determined, the amount of deflection is determined by the electric field determined by the distance and the voltage difference between electrodes, the acceleration voltage of a charged particle beam, and the distance between the charged particle beam passing through a through hole and the electrical charge. As the distance between the charged particle beam passing through a through hole and the electrical charge increases, the influence of the electrical charge on the charged particle beam becomes smaller, and the amount of deflection becomes smaller. Accordingly, when the distance and the voltage difference between electrodes and the acceleration voltage value of the charged particle beam are determined, calculation can be made as to how far the through hole is from the charged surface in order to obtain a deflection having a desired value (see Non-Patent Document 1). On the basis of the above-described characteristics, by analyzing the electrostatic field and the path of a charged particle beam by using the electrical charge distribution on a creepage surface as a boundary condition, numerical calculation can be made to determine how much axial displacement s occurs in accordance with the distance l from a creepage surface of the spacer or the unprotected portion of the electrode. In contrast, when an allowed value of center distance precision, i.e., an allowed amount of axial displacement, s is determined, the distance l, i.e., the minimum value is, is set so as to satisfy the above-described inequality, thereby obtaining the effect of the electrostatic lens according to the first embodiment of the present invention.

Hereinafter, embodiments of the present invention will be described in more detail on the basis of the accompanying drawings.

Figure 1B:
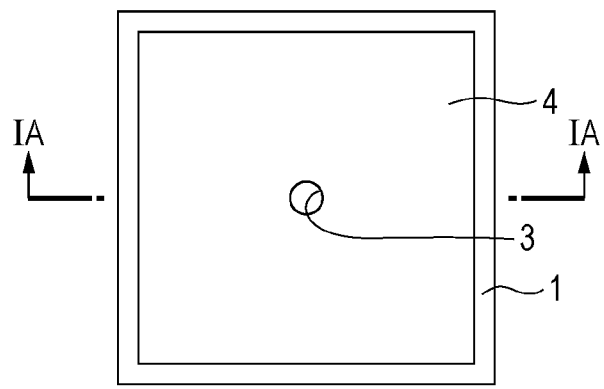

FIGS. 1A to 1D are schematic diagrams for explaining an electrostatic lens according to an embodiment of the present invention. FIG. 1A is a sectional view taken along line IA-IA in FIG. 1B, and FIG. 1B is a top view of the electrostatic lens. As illustrated in FIG. 1A, the electrostatic lens according to the embodiment includes two electrodes, i.e., a first electrode 1A and a second electrode 1B, between which an insulating spacer 2 fixing an interval between the electrodes is disposed. The first electrode 1A and the second electrode 1B each have a through hole 3 for passing charged particles, and are positioned so that the corresponding through holes 3 of the two electrodes are located at a desired position which is typically a position at which the through holes 3 are aligned in line in the optical axis direction. In addition, the electrodes are fixed with the spacer 2 which is interposed therebetween and which is designed so that the distance between the opposing surfaces of the electrodes in the optical axis direction is a desired distance.

To each electrode of the first electrode 1A and the second electrode 1B, voltage of a desired level can be applied, and this configuration can serve as an electrostatic lens when charged particles pass through the through hole 3. As an electrode material, a conductive material is used. In particular, to manufacture an electrostatic lens of high performance, Si is desirable in view of accuracy of processing. As the substrate of a Si electrode, a Si substrate or a silicon-on-insulator (SOI) substrate may be used. To form the through hole 3, it is necessary to use a method in which a fine shape can be formed in high accuracy, and, for example, a combination of lithography and deep dry etching may be used.

On both surfaces of the first electrode 1A, a protective film 4 is disposed, and on those of the second electrode 1B, another protective film 4 is disposed. Each of the protective films 4 is formed on the interior wall of the through hole 3 and in a region around the through hole on each of the surfaces of the electrode so as to extend continuously from the interior wall to the end portion of the electrode without a gap. The protective film 4 is not formed between the first electrode 1A and the spacer 2 and between the second electrode 1B and the spacer 2, i.e., at an interface between the spacer surface and each of the electrode surfaces opposing each other. By providing the protective film 4 on the electrode surfaces, oxidation of the electrode surfaces is prevented, enabling avoidance of the influence of charging or the like on charged particles passing through the through hole 3. As a material used to form the protective film 4, a platinum group metal which is unlikely oxidized, or a metal such as molybdenum which has a conductive oxide, may be used. Alternatively, a conductive oxide may be used. Any method for forming a film may be used as long as a uniform film can be formed in the entire region including the inner surface of the through hole 3. Examples of the method include sputtering and metal organic chemical vapor deposition (MOCVD).

The spacer 2 is integrated with the first electrode 1A and the second electrode 1B to keep the distance between the electrodes at a desired distance and to keep a state in which the corresponding through holes 3 of the two electrodes are positioned at desired positions. As a material used to form the spacer 2, an insulating material is used. For example, borosilicate glass or non-alkali glass may be used.

Referring to FIG. 1A, the relationship between the distance between the protective film 4, which is necessary to prevent beam deflection caused by charging, and the through hole 3 and the amount of axial displacement of charged particles will be described. In FIG. 1A, the minimum distance $1s$ indicates the shortest distance among the distances (end portion distances) 1 between the end portions of the protective film 4 on an electrode surface bonded to the spacer 2 and the center of the through hole 3. In an example of the present invention, to reduce the amount of the axial displacement to an allowed value s or less, an end portion distance l is to satisfy Expression 1. Accordingly, the minimum distance $1s$ is equal to the value obtained from the equation in Expression 1. For example, the minimum distance $1s$ is 3.1 mm when the following settings are provided: the distance between the electrodes g is 300 µm; the applied voltage difference $\Delta\phi$ is 3.7 kV; the absolute value of acceleration voltage $\phi acc$ is 5 kV; and the allowed amount of charge deflection s is 0.2 nm. In FIG. 1A, the minimum distance $1s$ is illustrated only from the end portion of the protective film on an electrode surface opposing the other electrode. However, the minimum distance $1s$ from the end portion of the protective film on an electrode surface which does not oppose the other electrode is similar to this. However, since a portion for mounting the spacer is not provided on the electrode surface which does not oppose the other electrode, the protective film on the electrode surface may be formed over the entire electrode surface.

$$l \geq (5 \times 10^3/3) \times (g/\phi acc) \times [-10.5 + \ln(g\Delta\phi/s)] \quad \text{Expression 1}$$

Integral bonding at a bonding interface between a surface of the electrode 1A or 1B and a surface of the spacer 2 may be made by a bonding method which is selected as appropriate from, for example, anodic bonding, surface activated bonding, eutectic bonding, fusion bonding, brazing, and epoxy adhesion. However, to prevent beam deflection due to charging as described above, the electrodes 1A and 1B and the spacer 2 are not bonded, and are attached with each other by using a mechanical tool so as to be simply fixed with each other.

In contrast, to achieve a configuration in which high-precision positioning of component members of an electrostatic lens can be achieved and maintained and which can be easily handled, it is desirable that the electrodes and the spacer be integrated by bonding. A more desirable configuration is that the spacer surface and the electrode surface are integrated by a direct chemical bond, i.e., bonding through some chemical reaction of substances on both surfaces without intervening substances. An example of the direct chemical bond between a spacer surface and an electrode surface is the bonding by anodic bonding or fusion bonding. Specific examples are the bonding of a silicon electrode and a borosilicate glass spacer by anodic bonding, and the bonding of a silicon electrode and a borosilicate glass or non-alkali glass spacer by fusion bonding. Among these, using the bonding of a silicon electrode and a borosilicate glass or non-alkali glass spacer by fusion bonding, the temporary bonding process after alignment can be performed at a low temperature approximate to the room temperature. In this case, this process is performed at a temperature at which no influences of expansion and contraction of members are received, whereby temporary bonding of an electrode and glass achieves a certain strength, while the positioning state obtained by alignment is maintained. Accordingly, in a permanent bonding process, an influence of expansion and contraction of members is unlikely exerted under the heat treatment condition used in the permanent bonding, e.g., under the temperature condition of approximately 200° C., and the initial positioning state obtained by the alignment can be maintained. Thus, this method is particularly desirable to achieve and maintain high-precision positioning, and the positioning precision of the order of 0.5 to 1 µm may be expected. In this bonding, a dissimilar material between a silicon electrode and a glass spacer is undesirable to attain a stable bonding state. In an example of the present invention, it is desirable that no protective films be provided at an interface between an electrode and a spacer. In particular, in the case of fusion bonding, since bonding can be made by activating an electrode surface by plasma treatment, a large restriction is imposed on the substrate surface. Accordingly, when a protective film is provided at an interface between an electrode and a spacer, bonding is extremely difficult and it is necessary to provide no protective films at an interface between the electrode and the spacer.

More specific embodiments will be described below.

First Embodiment

Figure 1C:
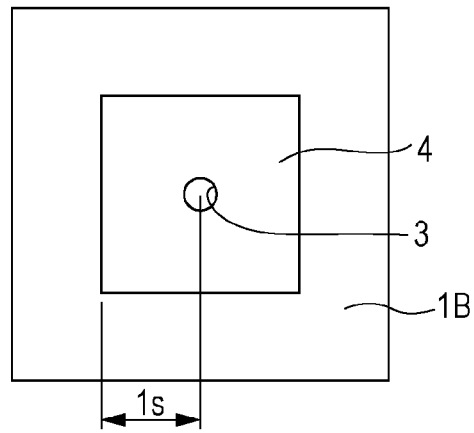
Figure 1D:
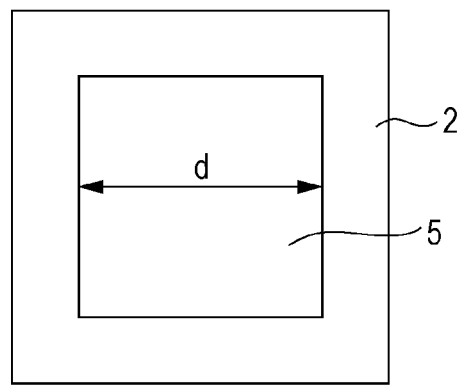

FIG. 1C is a top view of the second electrode 1B illustrated in FIG. 1A. The protective film 4 on the lower surface side of the first electrode 1A has the same pattern. FIG. 1D is a top view of the spacer 2. The electrostatic lens according to the first embodiment includes the two electrodes 1A and 1B and the spacer 2 constituted by a single plate. The electrodes 1A and 1B are formed of single crystal silicon of 100 μm thickness, and the spacer 2 is formed of non-alkali glass of 300 μm thickness.

The through hole 3 of an electrode is a through hole of 100 μm in diameter formed by photolithography and deep dry etching. The protective film 4 is formed by depositing Pt of 50 nm thickness on each of both surfaces of an electrode by sputtering. At that time, by performing a sputtering process once on the front side of the electrode substrate and another sputtering process once on the back side, a film is formed in a region including the inside of the through hole 3. The protective film 4 continuously extends from the region in the through hole 3 and is formed on the front and back sides of the electrode substrate. As a patterning method for forming a Pt film only in a desired region, an etching method or a lift-off method may be used. According to the first embodiment, a lift-off method using a resist was used. As illustrated in FIG. 1C, the minimum distance 1s was set to 3.5 mm on the front side of the electrode 1B. On the back side of the electrode 1B, the minimum distance 1s larger than this. This relationship is inverse for the end portions of the protective film 4 on the front and back sides of the electrode 1A. The pattern of the protective film 4 on the back side of the electrode 1A is illustrated in FIG. 1B. A through hole 5 of the spacer 2 is formed by performing a blasting process to form a square-shaped through hole in which a distance d illustrated in FIG. 1D is 8 mm.

Bonding of the electrodes 1A and 1B and the spacer 2 manufactured in the processes as described above is made by fusion bonding. In the fusion bonding, the following processes are performed in this sequence: (1) cleaning of the substrates; (2) activation of the surfaces by plasma treatment; (3) alignment between the substrates; (4) temporary bonding at room temperature; and (5) permanent bonding by annealing at a temperature of 200° C. Specifically, after temporary bonding is performed through the processes (1) to (4) on the first electrode 1A and the spacer 2, the processes (1) to (5) are performed in this sequence on the temporarily bonded body constituted by the first electrode 1A and the spacer 2, and the second electrode 1B. As described above, the electrodes and the spacer are processed and bonded, allowing an electrostatic lens to be manufactured in which positioning is made with high precision and which can be easily handled. A voltage is applied to the two electrodes 1A and 1B of the electrostatic lens described above by using a charging unit (not illustrated). When an electron beam was passed under a condition that the applied potential difference 4 was 3.7 kV and that the acceleration voltage φacc was 5 kV, the amount of axial displacement s was 0.2 nm or less, which is the expected allowed value or less.

Second Embodiment

Figure 2A:
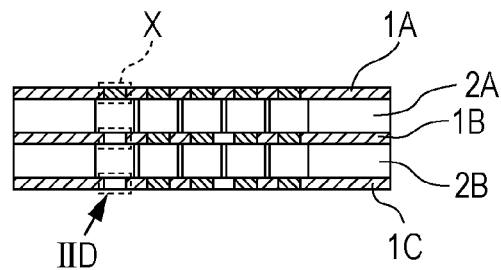
FIGS. 2A to 2D are schematic diagrams for explaining an electrostatic lens array according to an embodiment of the present invention.
Figure 2B:
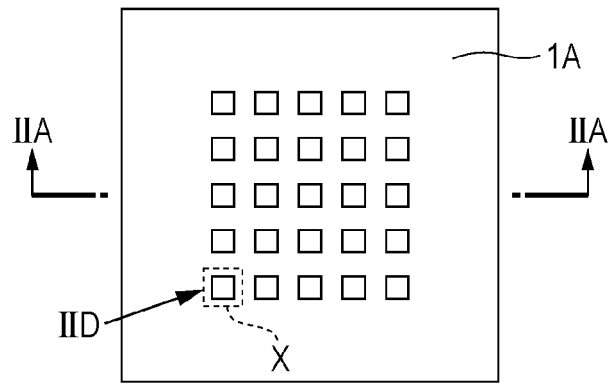
Figure 2C:
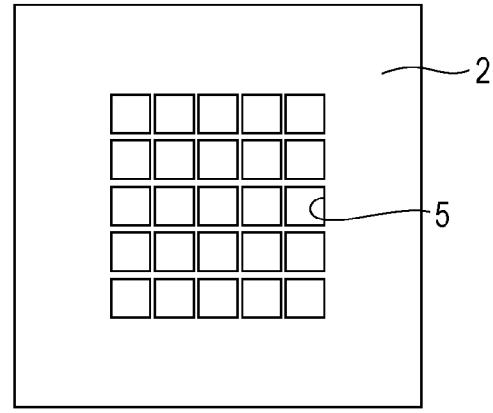
Figure 2D:
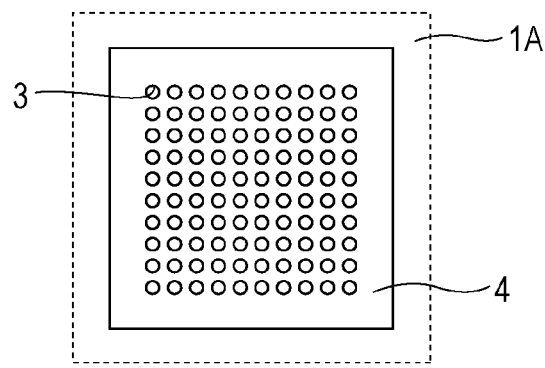

An electrostatic lens array according to a second embodiment includes electrodes having multiple through holes. Components having the same function as that according to the first embodiment are designated with the same reference characters, and the same effect will not be described. FIG. 2A is a sectional view of the electrostatic lens array, taken along line IIA-IIA in FIG. 2B. FIG. 2B is a top view of the electrostatic lens array. FIG. 2C is a top view of spacers 2A and 2B. FIG. 2D is an enlarged view of a region X surrounded by the dotted line in FIGS. 2A and 2B, and the regions X in three electrodes 1A, 1B, and 1C each have a structure similar to this.

According to the second embodiment, each of the electrodes has a 5×5 array of through hole regions X disposed therein. As illustrated in FIG. 2D, a through hole region denoted by X in FIGS. 2A and 2B includes a 10×10 array of through holes 3 disposed therein, and a protective film 4 is formed in and around the through holes. The number of electrodes and the number of through holes are not limited to these, and the numbers may be set as necessary. As illustrated in FIG. 2C, in a spacer 2, through holes 5 and a material portion are disposed in a shape of parallel crosses so as to reduce deformation of the electrodes, enabling the distance between the electrodes to be correctly fixed.

The three electrodes 1A, 1B, and 1C and the two spacers 2A and 2B as described above are bonded in a way similar to that according to the first embodiment, thereby forming an electrostatic lens array as illustrated in FIG. 2A. The electrostatic lens array according to the second embodiment includes the three electrodes 1A, 1B, and 1C and the two spacers 2A and 2B. This electrostatic lens array may be used as an Einzel electrostatic lens in which the two electrodes 1A and 1C that are located on the outer side have the same potential and in which a high potential is applied to the intermediate electrode 1B. According to the second embodiment, since multiple through holes 3 are provided in an electrode of the electrostatic lens array, the optical characteristics of multiple charged particle beams can be controlled, providing a suitable configuration for a large lens array. In the second embodiment, the through holes 3 and the protective films 4 can be also disposed so that the end portion distance l satisfies Expression 1.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-221424 filed Oct. 5, 2011, which is hereby incorporated by reference herein in its entirety.

What is claimed is:

1. An electrostatic lens comprising:
   a plurality of electrodes each having at least one through hole, corresponding ones of the through holes being aligned with each other; and
   an insulating spacer that is provided between the plurality of electrodes and that fixes an interval between the plurality of electrodes,
   wherein a protective film is disposed on a surface of each of the plurality of electrodes, the protective film is present on an interior wall of the at least one through hole and in a region around the at least one through hole on the surface of the electrode, the region extending continuously from the interior wall to an end portion of the electrode, and the protective film is not present between the electrode and the spacer, and
   wherein a distance l (meters) between an end portion of the protective film in the region around the at least one through hole and the center of the at least one through hole satisfies the following expression in the meter-kilogram-second-ampere unit system, $$l \geq (5 \times 10^3/3) \times (g/\phi acc) \times [-10.5 + \ln(g\Delta\phi/s)],$$

where a distance between the plurality of electrodes is represented by g (meters), a voltage difference between the plurality of electrodes is represented by $\Delta\phi$ (volts), an absolute value of an acceleration voltage of a charged particle beam is represented by $\phi acc$ (volts), and an allowed value of a center distance precision for the charged particle beam is represented by s (meters).

2. The electrostatic lens according to claim 1, wherein each of the plurality of electrodes is a Si electrode.

3. The electrostatic lens according to claim 1, wherein both surfaces of the spacer each are integral with a corresponding one of the plurality of electrodes by bonding.

4. The electrostatic lens according to claim 3, wherein through the bonding, a direct chemical bond is formed between a surface of the spacer and a surface of the plurality of electrodes.

5. An electrostatic lens comprising:

a plurality of electrodes each having at least one through hole, corresponding ones of the through holes being aligned with each other; and an insulating spacer that is provided between the plurality of electrodes and that fixes an interval between the plurality of electrodes, wherein both surfaces of the spacer each are integral with a corresponding one of the plurality of electrodes by bonding, and wherein a protective film is disposed on both surfaces of each of the plurality of electrodes, the protective film is present on an interior wall of the at least one through hole of the electrode and in a region around the at least one through hole on each of the surfaces of the electrode, the region extending continuously from the interior wall to an end portion of the electrode, and the protective film is not present between the electrode and the spacer.

6. The electrostatic lens according to claim 5, wherein through the bonding, a direct chemical bond is formed between a surface of the spacer and a surface of the plurality of electrodes.

7. An electrostatic lens array employing an electrostatic lens comprising:

a plurality of electrodes each having at least one through hole, corresponding ones of the through holes being aligned with each other; and an insulating spacer that is provided between the plurality of electrodes and that fixes an interval between the plurality of electrodes, wherein a protective film is disposed on a surface of each of the plurality of electrodes, the protective film is present on an interior wall of the at least one through hole and in a region around the at least one through hole on the surface of the electrode, the region extending continuously from the interior wall to an end portion of the electrode, and the protective film is not present between the electrode and the spacer, and wherein a distance l (meters) between an end portion of the protective film in the region around the at least one through hole and the center of the at least one through hole satisfies the following expression in the meter-kilogram-second-ampere unit system, $$l \geq (5\times 10^3/3)\times (g/\phi acc)\times [-10.5+\ln(g\Delta\phi/s)],$$

where a distance between the plurality of electrodes is represented by g (meters), a voltage difference between the plurality of electrodes is represented by $\Delta\phi$ (volts), an absolute value of an acceleration voltage of a charged particle beam is represented by $\phi acc$ (volts), and an allowed value of a center distance precision for the charged particle beam is represented by s (meters), wherein the at least one through hole includes a plurality of through holes, each of the plurality of electrodes has the plurality of through holes, and optical characteristics of a plurality of charged particle beams are controlled.

8. The electrostatic lens array according to claim 7, wherein the spacer and the protective film are not in contact with each other.

9. The electrostatic lens array according to claim 7, wherein s represents the center distance precision of the particle beam at the electrode farthest from a source of the particle beam.

\* \* \* \* \*